United States Patent
Noguchi

(10) Patent No.: US 9,117,625 B2
(45) Date of Patent: Aug. 25, 2015

(54) ELECTROSTATIC LENS AND CHARGED PARTICLE BEAM APPARATUS USING THE SAME

(71) Applicant: KYOCERA Corporation, Kyoto-shi, Kyoto (JP)

(72) Inventor: Yukio Noguchi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/348,559

(22) PCT Filed: Sep. 27, 2012

(86) PCT No.: PCT/JP2012/074947
§ 371 (c)(1),
(2) Date: Mar. 28, 2014

(87) PCT Pub. No.: WO2013/047688
PCT Pub. Date: Apr. 4, 2013

(65) Prior Publication Data
US 2014/0224999 A1     Aug. 14, 2014

(30) Foreign Application Priority Data
Sep. 30, 2011   (JP) ................. 2011-216760

(51) Int. Cl.
*G21K 5/04* (2006.01)
*H01J 37/12* (2006.01)
*H01J 37/28* (2006.01)
(Continued)

(52) U.S. Cl.
CPC ............... *H01J 37/12* (2013.01); *B82Y 10/00* (2013.01); *B82Y 40/00* (2013.01); *H01J 3/18* (2013.01); *H01J 37/28* (2013.01); *H01J 37/3007* (2013.01); *H01J 37/3177* (2013.01); *H01J 2237/03* (2013.01); *H01J 2237/1205* (2013.01)

(58) Field of Classification Search
USPC .............. 250/396 R, 397, 398, 492.1, 492.2, 250/492.21, 492.22, 492.3
See application file for complete search history.

(56) References Cited

U.S. PATENT DOCUMENTS

| | | | |
|---|---|---|---|
| 5,517,028 | A | 5/1996 | Ito et al. |
| 6,617,595 | B1 | 9/2003 | Okunuki |

(Continued)

FOREIGN PATENT DOCUMENTS

| | | |
|---|---|---|
| EP | 1505629 A2 | 2/2005 |
| JP | 7-161329 A | 6/1995 |

(Continued)

OTHER PUBLICATIONS

International Search Report, PCT/JP2012/074947, Oct. 15, 2012, 2 pgs.

*Primary Examiner* — Nicole Ippolito
(74) *Attorney, Agent, or Firm* — Volpe and Koenig, P.C.

(57) ABSTRACT

To provide an electrostatic lens which improves an irradiation accuracy of an electron beam while satisfying the need for higher throughput. An electrostatic lens according to one embodiment of the present invention includes a substrate which includes an insulating plate in which a plurality of first through holes that allow an electron beam to pass through are formed, a plurality of electrodes that are formed on an inner wall of the plurality of first through holes, and a plurality of wirings that are formed on the insulating plate and are electrically connected to each of the electrodes, wherein the plurality of electrodes are electrically independent from each other.

9 Claims, 5 Drawing Sheets

(51) Int. Cl.
*H01J 37/317* (2006.01)
*H01J 3/18* (2006.01)
*H01J 37/30* (2006.01)
*B82Y 10/00* (2011.01)
*B82Y 40/00* (2011.01)

(56) References Cited

U.S. PATENT DOCUMENTS

2002/0179855 A1* 12/2002 Muraki .................... 250/492.22
2005/0077475 A1* 4/2005 Nagae et al. ............... 250/396 R
2006/0255286 A1 11/2006 Kim
2008/0203881 A1 8/2008 Kim et al.

FOREIGN PATENT DOCUMENTS

| | | |
|---|---|---|
| JP | 2001-118491 A | 4/2001 |
| JP | 2002-353113 A | 12/2002 |
| JP | 2005-057110 A | 3/2005 |
| JP | 2006-528830 A | 12/2006 |
| JP | 2007-149655 A | 6/2007 |
| JP | 2008-543014 A | 11/2008 |
| JP | 2010-157369 A | 7/2010 |
| WO | 2005-010918 A1 | 2/2005 |
| WO | 2006-129940 A1 | 12/2006 |

* cited by examiner (a)

(b)

(a)

(b)

ELECTROSTATIC LENS AND CHARGED PARTICLE BEAM APPARATUS USING THE SAME

FIELD OF INVENTION

The present invention relates to electrostatic lenses which are for example used for scanning electron microscopes in semiconductor manufacturing processes or flat panel display (FPD) manufacturing processes and charged particle beam apparatuses such as electron beam lithography apparatuses, and also relates to charged particle beam apparatuses using the electrostatic lenses.

BACKGROUND

Charged particle beam apparatuses are known to include, for example, scanning electron microscopes that emit an electron beam onto a surface of an object such as a semiconductor wafer and a glass substrate and use a generated secondary electron beam, and electron beam lithography apparatuses for forming a fine wiring pattern on an object.

Japanese Unexamined Patent Application Publication No. 7-161329 discloses an electron beam apparatus which includes an electrostatic lens that allows a single axis electron beam to pass through.

When a plurality of electrostatic lenses are arranged, for example, in order to improve the throughput of the apparatus, it is difficult to align the plurality of electrostatic lenses since the electrostatic lenses are mechanically positioned. This may lead to variation in the distance between the electron beams which pass through the electrostatic lenses and often generates a non-irradiation area of the electron beam between the irradiation areas. Such a non-irradiation area often causes a non-observation area to be generated in the scanning electron microscope and a failure in wiring pattern to be occurred in the electron beam lithography apparatus.

Therefore, an electrostatic lens which improves an irradiation accuracy of an electron beam while satisfying the need for higher throughput is needed.

SUMMARY

The present invention provides an electrostatic lens which improves an irradiation accuracy of an electron beam while satisfying the need for higher throughput and a charged particle beam apparatus which uses the electrostatic lens.

According to one embodiment of the present invention, an electrostatic lens includes a substrate which includes an insulating plate in which a plurality of through holes that allow an electron beam to pass through are formed, a plurality of electrodes that are formed on an inner wall of the plurality of through holes, and a plurality of wirings that are formed on the insulating plate and are electrically connected to each of the electrodes. The plurality of electrodes are electrically independent from each other.

According to the electrostatic lens in one embodiment of the present invention, the irradiation accuracy of the electron beam can be increased while improving the throughput.

BRIEF DESCRIPTION OF THE DRAWINGS

FIG. 1 FIG. 1(a) is a sectional view of a charged particle beam apparatus in a thickness direction according to one embodiment of the present invention, and FIG. 1(b) is a sectional view of the charged particle beam apparatus of FIG. 1(a) in a plane direction of an electrostatic lens.

FIG. 3 FIG. 3(a) is a partial enlarged view of FIG. 1(a), and FIG. 3(b) is a perspective view which shows that part of the frame shown in FIG. 3(a) is reversed.

FIG. 4 FIG. 4(a) is a partial enlarged view of the substrate shown in FIG. 2, and FIG. 4(b) is a sectional view which shows a connection structure between the electrostatic lens shown in FIGS. 1(a) and 1(b) and an external circuit in the thickness direction of the electrostatic lens.

FIG. 7 FIG. 7(a) is a sectional view in the plane direction of the electrostatic lens according to another embodiment of the present invention, and FIG. 7(b) is a sectional view in the thickness direction of the electrostatic lens shown in FIG. 6(a).

DETAILED DESCRIPTION OF THE PREFERRED EMBODIMENTS

Figure 1:
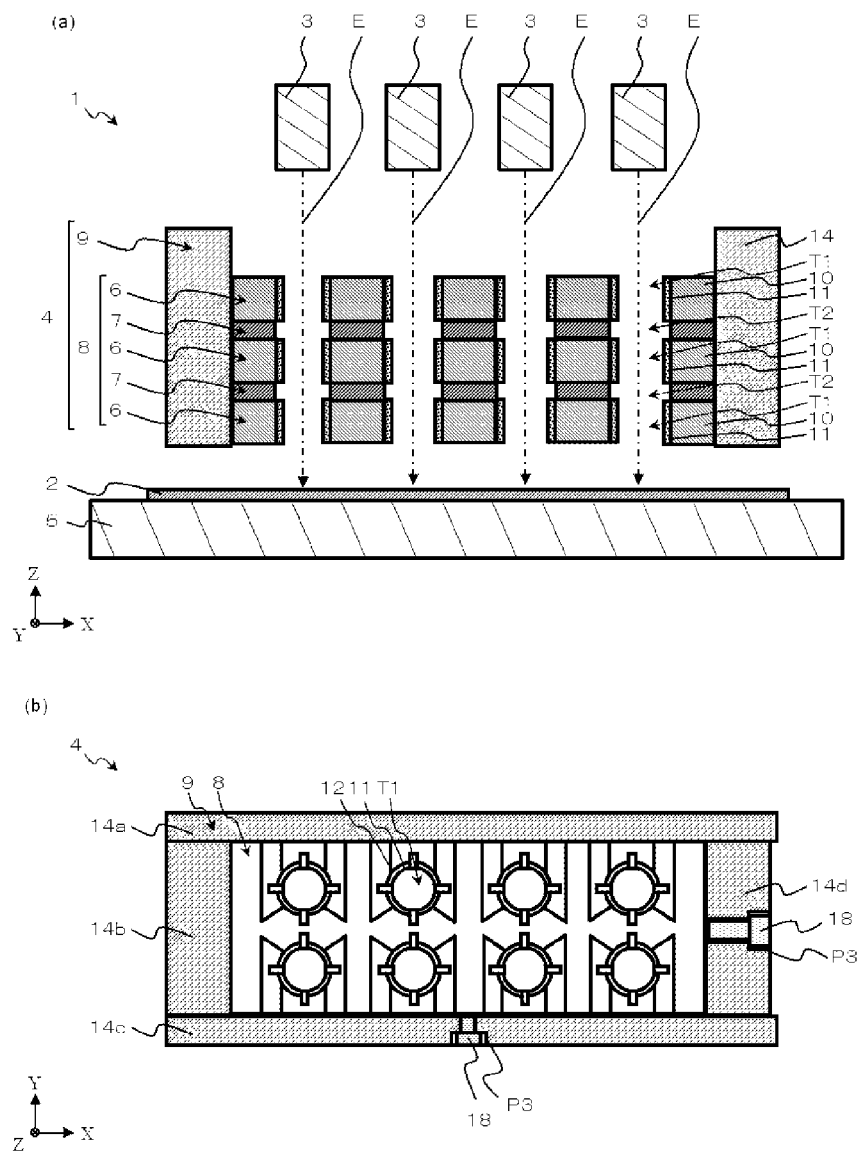

A charged particle beam apparatus which uses an electrostatic lens according to one embodiment of the present invention will be described in detail with reference to FIGS. 1 through 4.

A charged particle beam apparatus 1 shown in FIGS. 1(a) and 1(b) is, for example, used for a scanning electron microscope (SEM) that emits an electron beam E onto a surface of an object 2 such as a semiconductor wafer and a glass substrate and observes the object 2 using a generated secondary electron beam in a semiconductor manufacturing process or a flat panel display (FPD) manufacturing process, and an electron beam lithography apparatus for forming a fine wiring pattern on the object 2.

The charged particle beam apparatus 1 includes a plurality of electron guns 3 that emit a plurality of electron beams E, a plurality of electrostatic lenses 4 through which the plurality of electron beams E pass, and a stage 5 on which the object 2 is placed so that the plurality of electron beams E are emitted onto the object 2. The charged particle beam apparatus 1 performs positioning of object 2 on the stage 5, emits the electron beams E from the electron guns 3, performs control such as extraction, acceleration and deflection of the electron beams E by the electrostatic lens 4, and then emits the electron beams E onto the object 2 to form a wiring pattern or observe the object.

The electrostatic lens 4 selects the observation area or forms the wiring pattern in a precise manner by controlling the intensity or position of the electron beam E. The electrostatic lens 4 includes a stack body 8 which is formed by a plurality of alternatively stacked layers of substrates 6 and insulating spacers 7, and a frame 9 that surrounds the stack body 8 in a plan view.

Figure 2:
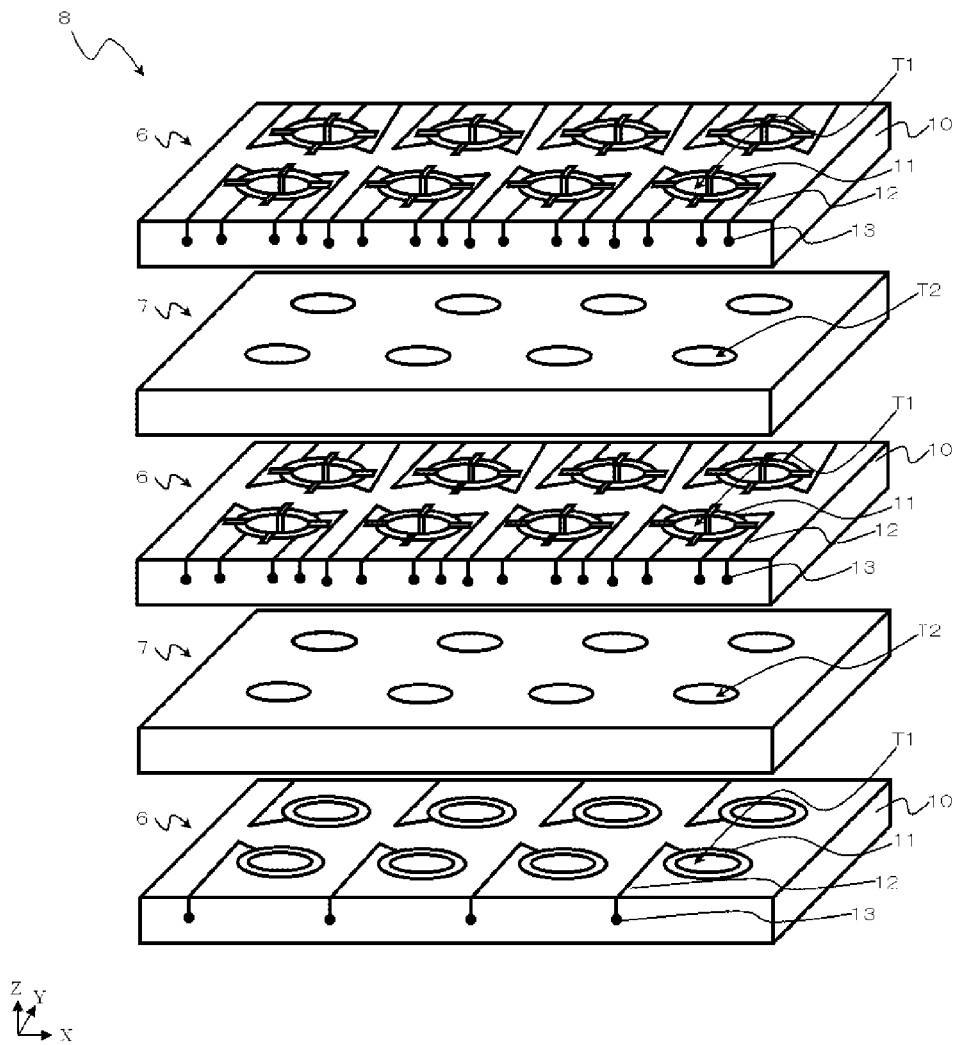
FIG. 2 FIG. 2 is a perspective view of a stack body of the electrostatic lens shown in FIGS. 1(a) and 1(b) which shows substrates and insulating spacers in a separated state.
Figure 3:
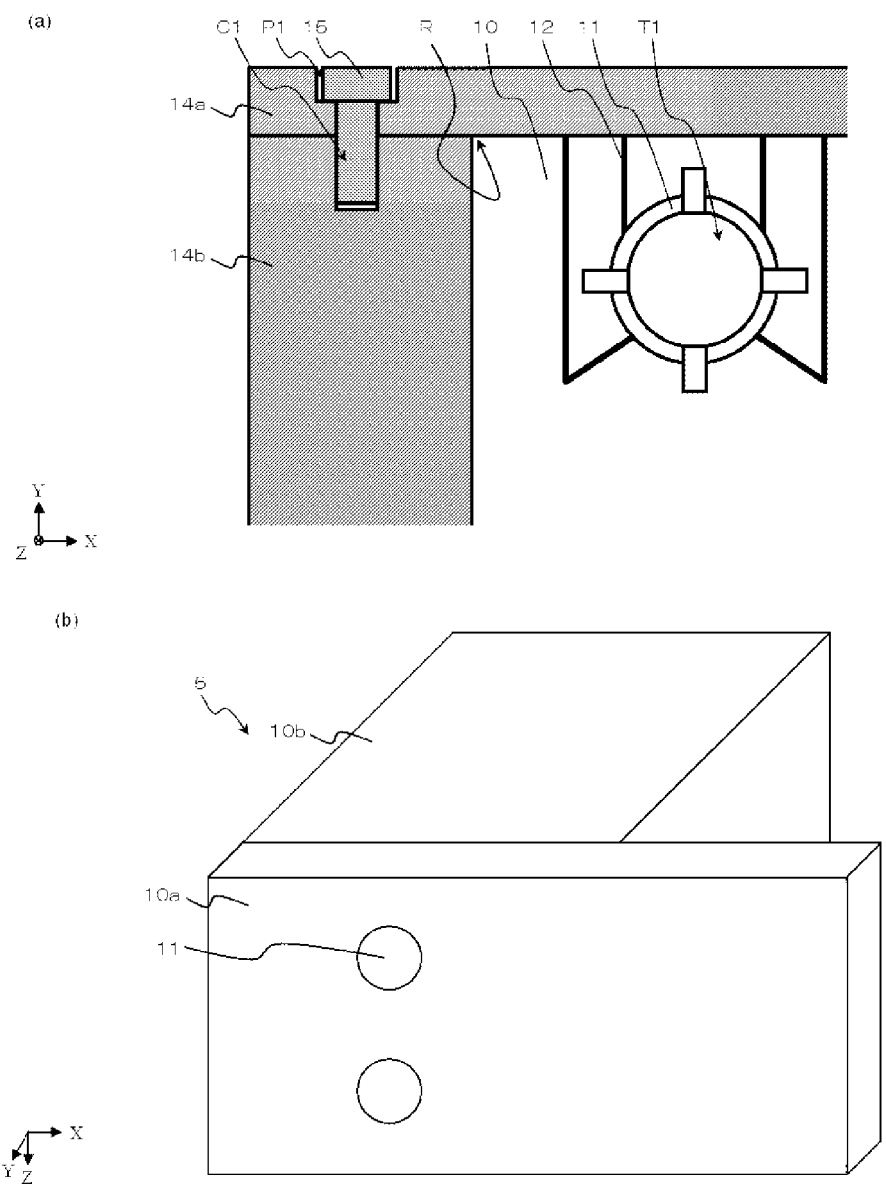
Figure 4:
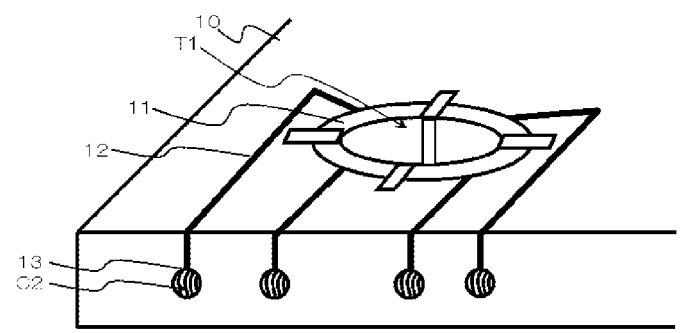
Figure 4:
Figure 4:
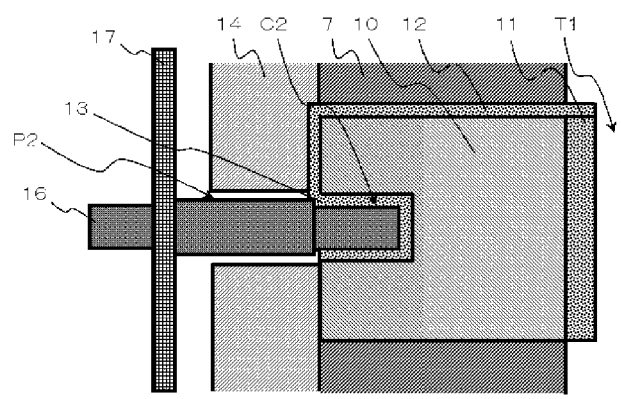

As shown in FIG. 2, the substrate 6 includes an insulating plate 10 in which a plurality of first through holes T1 that allow the plurality of electron beams E to pass through are formed, a plurality of electrodes 11 that are formed on an inner wall of the plurality of first through holes T1, and a plurality of wirings 12 that are formed on the insulating plate 10 and are electrically connected to each of the electrodes 11.

The insulating plate 10 isolates the respective electrodes 11 formed on the inner wall of the respective first through holes T1, and can be made of a ceramic material such as alumina, zirconia and silicon nitride. In particular, from the view point of processing accuracy, it is preferable that the material includes 90 weight percent or more and 99.9 weight percent or less of alumina as a main component.

The insulating plate 10 is, for example, in a plate shape and also a cuboid shape. The thickness (Z direction) of the insulating plate 10 is, for example, 1 mm or more and 10 mm or less, the length (X direction) of the insulating plate 10 is, for example, 20 mm or more and 100 mm or less, and the width (Y direction) of the insulating plate 10 is, for example, 10 mm or more and 40 mm or less.

In a plane shape (XY plane) of the insulating plate 10, at least one corner is preferably a right angle. Accordingly, as described later, the frame 9 can be used to successfully align the respective substrates 6. This right angle corner has a tolerance of 0.5 degrees or less from 90 degrees. In this embodiment, the plane shape of the insulating plate 10 is a rectangular shape having one set of long sides and one set of short sides as shown in FIG. 1(a).

In the stack body 8, it is preferable that the insulating plates 10 of the respective substrates 6 have the same plane shape. As a result, the respective substrates 6 can be successfully aligned in the stack body 8.

The first through hole T1 is a space that allows the electron beam E to pass through, and the plurality of first through holes T1 are formed in the insulating plate 10. In this embodiment, eight first through holes T1 are arranged in two rows and four lines (2×4) in each insulating plate 10. Further, it is preferable that the first through hole T1 is formed, for example, in a cylindrical shape and has a diameter of, for example, 1 mm or more and 8 mm or less, and the respective first through holes T1 have the same shape.

The electrode 11 has functions such as an acceleration electrode that controls the intensity of the electron beam E and a deflection electrode that controls the position of the electron beam E, and can be made of a metal material such as titanium, titanium alloy, palladium, gold and platinum. When the electrode 11 is used as an acceleration electrode, one electrode (single pole) is formed in one first through hole T1. When the electrode 11 is used as a deflection electrode, a plurality of electrodes 11 (multi-pole) are formed in one first through hole T1 in the circumferential direction. Examples of multi-pole electrode 11 may include two-pole, four-pole and eight-pole electrodes 11.

In this embodiment, as shown in FIG. 2, the uppermost and intermediate substrates 6 use the four-pole electrodes 11 as deflection electrode, while the lowermost substrate 6 uses the single pole electrodes 11 as acceleration electrode.

The wirings 12 supply electricity from an external circuit to the electrodes 11, and can be made of a metal material such as silver, silver alloy, copper, titanium, titanium alloy, palladium, gold and platinum. Each wiring 12 is connected to an end of any one of the electrodes 11 on one main surface of the insulating plate 10, and is routed to an end face of the insulating plate 10 and is connected to an external terminal 16, which will be described later, at a connection end 13. The wirings 12 are electrically independent from each other. In the uppermost and intermediate substrates 6 shown in FIG. 2, each of the electrically independent wirings 12 are connected to each of the four poles of the electrodes 11 which are formed in one first through hole T1.

Moreover, each of the insulating spacers 7 which are alternatively stacked with the substrates 6 includes a plurality of second through holes T2 at positions which correspond to the positions of the respective first through holes T1 of the substrates 6 which are disposed on the upper and lower sides of the insulating spacer 7. Although the second through hole T2 is also a space that allow the electron beam E to pass through, the second through hole T2 differs from the first through hole T1 in that an electrode is not formed in the second through hole T2. Accordingly, the insulating spacer 7 can electrically insulate the electrodes 11 of the adjacent substrates 6 while allowing the electron beams E to pass through the second through holes T2.

The insulating spacer 7 can be made of a ceramic material such as alumina, zirconia and silicon nitride. In particular, it is preferable that the insulating spacer 7 includes the same material as that of the insulating plate 10 as a main component in order to obtain a similar coefficient of thermal expansion to that of the insulating plate 10. Specifically, when the insulating plate 10 includes alumina as a main component, it is preferable that the insulating spacer 7 includes 90 weight percent or more and 95 weight percent or less of alumina as a main component and 5 weight percent or more and 10 weight percent or less of titanium oxide as an additive with a reduction treatment performed. As a result, a surface resistivity of the insulating spacer 7 can be 109 $\Omega/\square$ or more and 1012 $\Omega/\square$ or less, thereby reducing a charge-up of the inner wall of the second through hole T2 caused by the electron beam E.

Further, the insulating spacer 7 is, for example, in a plate shape and also a cuboid shape. The thickness (Z direction) of the insulating spacer 7 is, for example, 1 mm or more and 10 mm or less. The length (X direction) of the insulating spacer 7 is, for example, 20 mm or more and 100 mm or less. The width (Y direction) of the insulating spacer 7 is, for example, 10 mm or more and 40 mm or less.

In the stack body 8, it is preferable that the respective insulating spacers 7 are the same in the plane shape (XY plane) with each other and are also the same in the plane shape of the respective insulating plates 10. As a result, in the stack body 8, the insulating spacers 7 can be successfully aligned with the substrates 6 and other insulating spacers 7. In addition, it is preferable that thickness of the insulating spacer 7 is smaller than that of the insulating plate 10. As a result, a charge-up of the inner wall of the second through hole T2 can be reduced.

The second through hole T2 is, for example, in a cylindrical shape and has the diameter of, for example, 1 mm or more and 8 mm or less. In this embodiment, as shown in FIG. 1(b), the diameter of the second through hole T2 is the same as that of the first through hole T1.

The above described stack body 8 can supply electricity from an external circuit 17 to the electrode 11 via the wiring 12 for controlling the intensity or the position of the electron beam E which passes through the first through hole T1. In the stack body 8, the first through holes T1 of the respective substrates 6 and the second through holes T2 of the respective insulating spacers 7 are positioned to correspond and communicate with each other so that single axis electron beam passage holes that penetrate in the stacking direction of the stack body 8 are formed. Therefore, in the single axis electron beam passage holes, both the intensity and position of the electron beam E can be precisely controlled by independently controlling the electrodes 11 of the respective substrates 6 which are deflection electrodes or acceleration electrodes.

Further, the stack body 8 is made by the plate shaped substrates 6 and the insulating spacers 7 which are alternatively staked and aligned with each other and is formed in a cuboid shape. The both main surfaces of the stack body 8 (XY plane) are made by the main surfaces of the outermost substrate 6 or the insulating spacer 7, and the side faces of the stack body 8 which extend in the stacking direction (Z direction) are made by the side faces of the respective substrates 6 and the respective insulating spacers 7. In this embodiment, since the corners of the respective substrates 6 and the respective insulating spacers 7 in the plane shape are formed to be right angle, the adjacent side faces of the stack body 8 are perpendicular to each other.

The frame 9 secures and holds the respective substrates 6 and the respective insulating spacers 7 of the stack body 8 while supplying electricity from an external circuit to the electrodes 11 of the respective substrates 6 of the stack body 8. The frame 9 includes four plates 14 which are connected to each other in an annular shape in plan view, a connection member 15 that secures the plates 14 at a connection section, and the external terminal 16 that penetrates the plate 14 and is connected to the wiring 12.

The respective plates 14 are connected to each other by abutting part of the main surface of one plate 14 against the end face of another plate 14 so that the plates 14 form the frame 9 of a rectangular tubular shape. The plate 14 can be made of a ceramic material such as alumina, zirconia and silicon nitride. In particular, it is preferable that the ceramic material includes the same material as that of the insulating plate 10 in order to obtain similar coefficient of thermal expansion to that of the insulating plate 10. Further, the respective plates 14 are formed, for example, in a plate shape and a cuboid shape, and have the thickness of 4 mm or more and 20 mm or less.

The four plates 14 are hereinafter referred to as a first plate 14a, a second plate 14b, a third plate 14c and a fourth plate 14d for convenience. In the frame 9, one end face of the second plate 14b and one end face of the fourth plate 14d are abutted and connected to one main surface of the first plate 14a, while the other end face of the second plate 14b and the other end face of the fourth plate 14d are abutted and connected to one main surface of the third plate 14c. Further, the first plate 14a and the third plate 14c oppose each other, while the second plate 14b and the fourth plate 14d oppose each other.

The connection member 15 penetrates between both main surfaces of one plate 14 in the thickness direction and is connected to the end face of another plate 14 at the connection section of the plates 14 so that the connection member 15 secures the plates 14 in a connected state. The connection member 15 may be, for example, a metal screw or bolt. In FIGS. 3(a) and 3(b), the connection member 15 is inserted into and connected to a first through hole P1 that penetrates between both main surfaces of the first plate 14a in the thickness direction and a first recess C1 formed on the end face of the second plate 14b. Further, the plates 14 are also connected by the connection members 15 at connection sections other than the connection sections between the first plate 14a and the second plate 14b.

The external terminal 16 electrically connects the external circuit 17 such as a flexible printed substrate and the wiring 12 of the substrate 6. The external terminal 16 is electrically connected to the external circuit 17 at one end and to the wiring 12 at the other end at the end face of the insulating plate 10. The external terminal 16 may be, for example, a metal screw or bolt. In FIGS. 4(a) and 4(b), the external terminal 16 is inserted into and mechanically connected to a second through hole P2 formed on the plate 14 and a second recess C2 formed on the end face of the insulating plate 10, and is also electrically connected to the connection end 13 formed on the inner surface of the second recess C.

As described above, in the electrostatic lens 4 of this embodiment, the plurality of first through holes T1 that allow the electron beams E to pass through are formed in the insulating plate 10. Accordingly, the respective first through holes T1 can be arranged at closely adjacent positions and the positioning accuracy can be increased by providing the plurality of first through holes T1 in the insulating plate 10, and a plurality of axes of the electron beam passage holes can be formed in the electrostatic lens 4 as a multi-lens type electrostatic lens, thereby improving the throughput of the charged particle beam apparatus 1. As a result, a non-irradiation area between the axes of the respective electron beams E can be reduced, thereby increasing the irradiation accuracy of the electron beam E and improving the throughput in the multi-lens type electrostatic lens 4.

Furthermore, the electrodes 11 formed in the respective first through holes T1 are electrically independent from each other. Since the electrodes 11 can be individually controlled via the wirings 12, the respective electron beams E can be individually controlled in the multi-lens type electrostatic lens 4 so that drawing of wiring patterns and SEM observation can be performed independently in each of the irradiation areas. As a result, drawing of wiring patterns and SEM observation can be simultaneously performed at a plurality of positions, thereby increasing a processing amount for one time and significantly improving the throughput. Moreover, since the irradiation accuracy of the electron beam E is increased as described above, the independently performed drawing of wiring pattern and SEM observation can be combined with a high precision.

Since the insulating plate 10 is made of a ceramic material, the insulating plate 10 can be of high rigidity. Accordingly, the processing accuracy of the first through holes T1 can be improved. As a result, the positioning accuracy of the respective first through holes T1 can be improved, and thus the non-irradiation area between the axes of the respective electron beams E can be reduced in the multi-lens type electrostatic lens 4.

In the electrostatic lens 4 of this embodiment, in the frame 9, the end face which is perpendicular to one main surface of the second plate is abutted against part of one main surface of the first plate at the connecting section between the first plate 14a and the second plate 14b. Accordingly, at the connecting sections between the first plate 14a and the second plate 14b, right angle sections R can be formed on the inner periphery of the frame 9 with a high precision. The right angle section R has a tolerance of 0.5 degrees or less from 90 degrees.

In the stack body 8, a first side face is abutted against one main surface of the first plate 14a, while a second side face which is perpendicular to the first side face is abutted against one main surface of the second plate 14b. As a result, since the respective substrates 6 and the respective insulating spacers 7 of the stack body 8 can be aligned with each other by using the right angle sections R of the frame 9 as a reference, the first through holes T1 of the respective substrate 6 and the second through holes T2 of the respective insulating spacers 7 can be precisely aligned.

Alignment of the respective substrates 6 and the respective insulating spacers 7 by using the right angle sections R of the frame 9 as a reference can be performed, for example, by forming third through holes P3 in the third plate 14c and the fourth plate 14d, inserting a fixation member 18 such as a metal screw into the third through holes P3, pressing the stack body 8 by the fixation member 18, and abutting the stack body 8 against the first plate 14a and the second plate 14b to hold the stack body 8. In this alignment, the respective substrates 6 and the respective insulating spacers 7 may be only abutted against the first plate 14a and the second plate 14b and are not abutted against the third plate 14c and the fourth plate 14d. Further, a plurality of third through holes P3 and fixation members 18 are used depending on the respective substrates 6 and the respective insulating spacers 7.

In this embodiment, the thickness of the first plate 14a is smaller than that of the second plate 14b. As a result, as the thickness of the first plate 14a decreases, the connection member 15 can penetrate between both main surfaces of the first plate 14a easier. Further, as the thickness of the second plate 14b increases, the connection member 15 can be connected to the end face of the second plate 14b easier since a width of the end face of the second plate 14b becomes larger. The thickness of the first plate 14a is, for example, 4 mm or more and 10 mm or less, and the thickness of the second plate 14b is, for example, 10 mm or more and 20 mm or less. The thickness of the second plate 14b is, for example, two times or more and five times or less of the thickness of the first plate 14a.

In this embodiment, the plurality of first through holes T1 formed in one insulating plate 10 are arranged in two rows along the long side of the insulating plate 10 in a plane shape. As shown in FIG. 1(a) and FIG. 2, the wirings 12 on the insulating plate 10 in which the first through holes T1 are arranged in two rows are routed to the end faces of the long sides of the insulating plate 10 adjacent to the electrodes 11 to which the wirings 12 are electrically connected. Accordingly, the routing of the wiring 12 on the main surface of the insulating plate 10 becomes easier and positioning of the connection ends 13 can be concentrated on both end faces of the long sides of the insulating plate 10. This facilitates connection to the external circuit 17 via the external terminal 16. Moreover, it is preferable that the connection ends 13 are arranged in a row along the long sides on the end faces located to the long sides of the insulating plate 10 as shown in FIG. 2.

As described above, the foregoing electrostatic lens 4 has a function to individually control the intensity or the position of the plurality of electron beams E in a charged particle beam apparatus 1.

Next, a method for manufacturing the foregoing electrostatic lens 4 will be described.

(1) The substrate 6 is manufactured. Specifically, the manufacturing is performed, for example, in the following procedures.

First, ceramic powder is formed into a formed body by using various forming methods. Next, the formed body is sintered at a temperature of, for example, 1400 degrees C. or more and 1800 degrees C. or less to form the insulator 6. Then, the first through hole T1 is formed on the insulator 6 by grinding. Then, the second recess C2 is formed on the insulator 6 by grinding. Then, the electrode 11 and the wiring 12 are formed on the insulating plate 10 by depositing a metal film by using plating, sputtering, vacuum vapor deposition or other process.

The substrate 6 can be thus manufactured.

Furthermore, grooving can be performed to separate the metal film deposited on the first through hole T1 in the penetration direction by grinding so as to form two poles or more of the electrode 11.

Alternatively, the electrode 11 may be formed by brazing a metal piece on the first through hole T1 by using silver or the like and then by grooving using electric discharge machining or reaming.

(2) The insulating spacer 7 is manufactured. Specifically, the manufacturing is performed, for example, in the following procedures.

First, ceramic powder is formed into a formed body by using various forming methods. Next, the formed body is sintered at a temperature of, for example, 1400 degrees C. or more and 1800 degrees C. or less to form the insulating spacer 7. Then, the second through holes T2 are formed on the insulating spacer 7 by grinding.

The insulating spacer 7 can be thus manufactured.

(3) The frame 9 is manufactured. Specifically, the manufacturing is performed, for example, in the following procedures.

First, ceramic powder is formed into a formed body by using various forming methods. Next, the formed body is sintered at a temperature of, for example, 1400 degrees C. or more and 1800 degrees C. or less to form four plates 14. Then, the first through hole P1, the second through hole P2, the third through hole P3 and the first recess C1 are formed on the plates 14 by grinding. Then, part of one main surface of one plate 14 is abutted against the end face of another plate 14 to align the first through hole P1 of the one plate 14 with the first recess C1 of the another plate 14, and then, the connection member 15 is inserted into and connected to both the first through hole P1 and the first recess C1 to connect the plates 14. In this manner, the four plates 14 are subsequently connected to each other.

The frame 9 can be thus manufactured.

(4) The electrostatic lens 4 is manufactured by forming the stack body 8 by subsequently stacking the substrates 6 and the insulating spacers 7 in the frame 9. Specifically, the manufacturing is performed, for example, in the following procedures.

First, a plurality of substrates 6 and the insulating spacers 7 are alternatively inserted into the tubular frame 9 so that the substrates 6 and the insulating spacers 7 are subsequently stacked. Then, the side faces of the respective substrates 6 and the side faces of the respective insulating spacers 7 are abutted against the first plate 14a and the second plate 14b by using the fixation member 15 to align and fix the positions of the respective substrates 6 and the respective insulating spacers 7 by using the right angle section R between the first plate 14a and the second plate 14b as a reference and form the stack body 8. In this process, the second through hole P2 of the plate 14 and the second recess C2 of the end face of the insulating plate 10 are aligned. Then, the external terminal 16 is connected to both the first through hole P1 and the first recess C1 to electrically connect the connection end 13 of the wiring 12 to the external terminal 16.

The electrostatic lens 4 can be thus manufactured.

The present invention is not limited to the above embodiments, and various alterations, modifications and combinations can be made without departing from the scope of the principle of the present invention.

Figure 5:
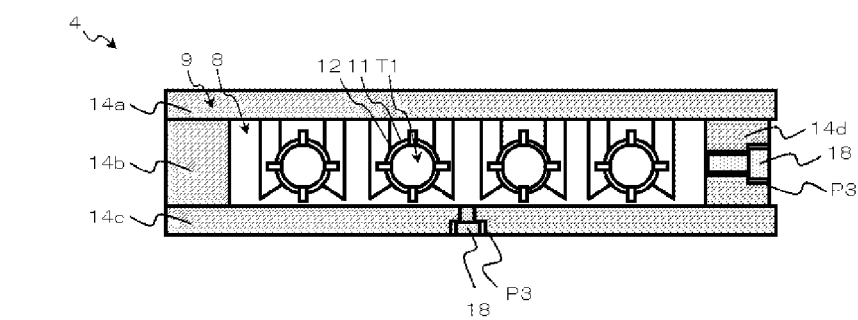
FIG. 5 FIG. 5 is a sectional view in the plane direction of the electrostatic lens according to another embodiment of the present invention.
Figure 5:

For example, although the above embodiments are described by means of an example in which a plurality of first through holes are arranged in two rows on the insulating plate, the plurality of first through holes may be arranged in any form on the insulating plate without being limited to two rows. As an example of other arrangement of the first through holes, as shown in FIG. 5, it is preferable that the plurality of first through holes T1 are arranged in two or more lines in a row along the long side of the insulating plate 8. As a result, similarly to the above embodiments, the wiring 12 can be easily routed on the main surface of the insulating plate 8. Specifically, connection of the wiring 12 to the external circuit 17 can be facilitated by routing the wiring 12 only to the end face located to one long side of the insulating plate 8 so that the connecting ends 13 are concentrically formed on that end face.

Further, although the above embodiments are described by means of an example in which the wirings are formed only on one of both main surfaces of the insulating plate, the wirings may be formed on both main surfaces of the insulating plate.

Figure 6:
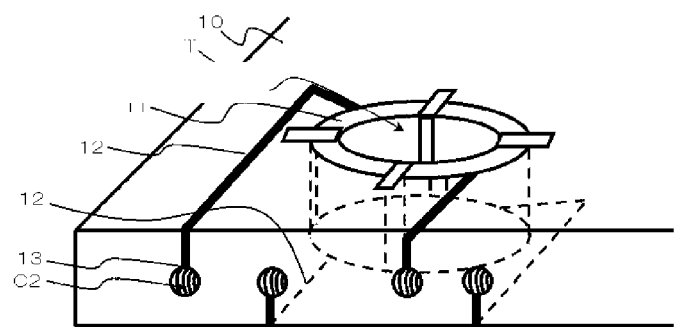
FIG. 6 FIG. 6 is a partial enlarged view which corresponds to FIG. 4(a) of the electrostatic lens according to another embodiment of the present invention.
Figure 6:

In the case where the wirings are formed on both main surfaces of the insulating plate, it is preferable that the wirings 12 which are adjacent to each other in the plane direction are each disposed on one main surface and the other main surfaces as shown in FIG. 6. In this arrangement, the freedom in wiring design on both main surfaces of the insulating plate 8 can be increased. In FIG. 5, the plurality of wirings 12 arranged along the long side of the insulating plate 8 are alternatively disposed on one main surface and the other main surface.

Further, although the above embodiments are described by means of an example in which the diameter of the first through hole of the substrate and the diameter of the second through hole of the insulating plate are the same, the diameter of the first through hole of the substrate and the diameter of the second through hole of the insulating plate may not be the same. Specifically, when the diameter of the second through hole is larger than the diameter of the first through hole, a configuration shown in FIGS. 7(a) and 7(b) is preferable.

Figure 7:
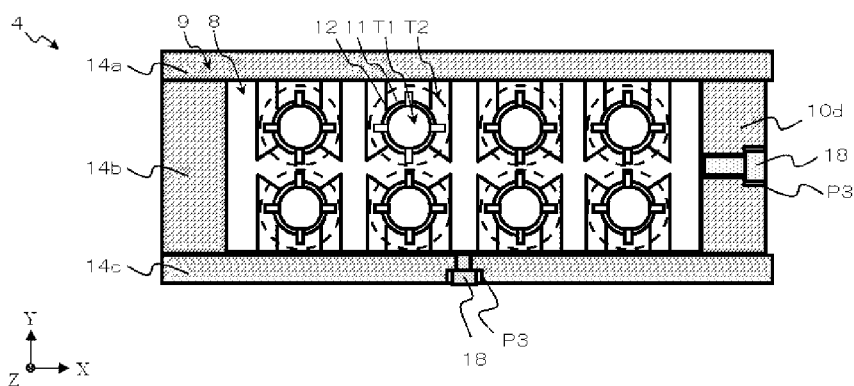
Figure 7:
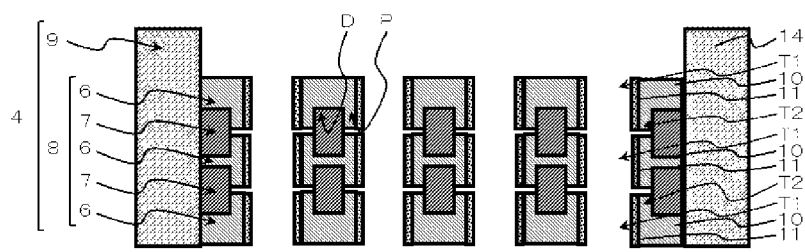
Figure 7:

In the configuration shown in FIGS. 7(a) and 7(b), recessed portions D having the plane shape which is the same as the insulating spacer 7 and the depth smaller than the thickness of the insulating spacer 7 and projected positions P that are disposed on a side closer to the first through hole T1 than to the recessed portion D are formed on the main surface of the insulating plate 10. Then, part of the main surface of the insulating spacer 7 is inserted into the recessed portions D and the projected positions P on the insulating plate 10 is embedded into the second through holes T2. As a result, the amount of exposure of the inner wall of the second through holes T2 to the electron beam passage holes can be reduced while keeping the insulating spacer 7 to have a certain thickness or more to maintain the strength, thereby reducing the charge-up of the inner wall of the second through hole T2.

Reference Signs List
1 charged particle beam apparatus
2 object
3 electron gun
4 electrostatic lens
5 stage
6 substrate
7 insulating spacer
8 stack body
9 frame
10 insulating plate
11 electrode
12 wiring
13 connection end
14 plate
14a first plate
14b second plate
14c third plate
14d fourth plate
15 connection member
16 external terminal
17 external circuit
18 fixation member
E electron beam
T1 first through hole
T2 second through hole
P1 first through hole
P2 second through hole
P3 third through hole
C1 first recess
C2 second recess
R right angle section
D recessed portion
P projected position

What is claimed is:

1. An electrostatic lens comprising a plurality of substrates that each includes an insulating plate in which:
a plurality of through holes that allow an electron beam to pass through are formed,
a plurality of electrodes are formed on an inner wall of the plurality of through holes, and
a plurality of wirings are formed on the insulating plate and are electrically connected to each of the electrodes, wherein the plurality of electrodes are electrically independent from each other, and
wherein a stack body is formed by stacking the plurality of substrates, and a frame that surrounds the stack body in plan view is further provided, and
wherein the frame includes a first plate and a second plate which are connected to each other and is configured such that an end face which is perpendicular to one main surface of the second plate is abutted against part of one main surface of the first plate at a connecting section between the first plate and the second plate, and the stack body is configured such that a first side face is abutted against the one main surface of the first plate and a second side face which is perpendicular to the first side face is abutted against the one main surface of the second plate thereby providing alignment of through holes of respective substrates.

2. The electrostatic lens according to claim 1 further comprising a screw member that penetrates between both main surfaces of the first plate of the frame in a thickness direction and is connected to the end face of the second plate.

3. The electrostatic lens according to claim 2, wherein a thickness between both main surfaces of the second plate is larger than a thickness between both main surfaces of the first plate.

4. The electrostatic lens according to claim 1, wherein the stack body includes an insulating spacer that is disposed between adjacent substrates.

5. The electrostatic lens according to claim 1, wherein the insulating plate is in a rectangular shape having a set of long sides and a set of short sides in a plan view, and the plurality of through holes are arranged in two rows along the long side.

6. The electrostatic lens according to claim 5, wherein the plurality of wirings are routed to an end faces located to the long sides which are adjacent to the electrodes to which the wirings are electrically connected.

7. The electrostatic lens according to claim 1, wherein the insulating plate is in a rectangular shape having a set of long sides and a set of short sides in a plan view, and the plurality of through holes are arranged in one row along the long side.

8. The electrostatic lens according to claim 7, wherein the plurality of wirings are routed to an end face located to one long side of the insulating plate.

9. A charged particle beam apparatus comprising: the electrostatic lens according to claim 1; and an electron gun that emits an electron beam which passes through the through hole of the electrostatic lens.

* * * * *